United States Patent
Parker et al.

(10) Patent No.: US 9,831,072 B2
(45) Date of Patent: Nov. 28, 2017

(54) SPUTTER TARGET AND SPUTTERING METHODS

(75) Inventors: Ronald M. Parker, Olive Branch, MS (US); Robert T. Rozbicki, Germantown, TN (US)

(73) Assignee: View, Inc., Milpitas, CA (US)

( * ) Notice: Subject to any disclaimer, the term of this patent is extended or adjusted under 35 U.S.C. 154(b) by 175 days.

(21) Appl. No.: 14/129,911

(22) PCT Filed: Jun. 14, 2012

(86) PCT No.: PCT/US2012/042514
§ 371 (c)(1),
(2), (4) Date: May 5, 2014

(87) PCT Pub. No.: WO2013/003065
PCT Pub. Date: Jan. 3, 2013

(65) Prior Publication Data
US 2014/0318947 A1    Oct. 30, 2014

Related U.S. Application Data (60) Provisional application No. 61/503,547, filed on Jun. 30, 2011.

(51) Int. Cl.
*H01J 37/34* (2006.01)
*C23C 14/56* (2006.01)
*C23C 14/34* (2006.01)

(52) U.S. Cl.
CPC ...... *H01J 37/3417* (2013.01); *C23C 14/3407* (2013.01); *C23C 14/56* (2013.01); *H01J 37/3414* (2013.01); *H01J 37/3435* (2013.01)

(58) Field of Classification Search
CPC .............. H01J 37/3407; H01J 37/3417; H01J 37/3414; H01J 37/3435; C23C 14/56; C23C 14/3407
USPC ............ 204/298.12, 298.13, 298.21, 298.22, 204/192.12, 192.26, 192.29
See application file for complete search history.

(56) References Cited

U.S. PATENT DOCUMENTS

| | | | | |
|---|---|---|---|---|
| 3,945,911 A | * | 3/1976 | McKelvey | .......... C23C 14/3407 204/298.09 |
| 4,412,907 A | | 11/1983 | Ito et al. | |
| 4,904,362 A | * | 2/1990 | Gaertner | ................. C23C 14/16 204/192.12 |
| 5,262,032 A | | 11/1993 | Hartig et al. | |

(Continued)

FOREIGN PATENT DOCUMENTS

| | | |
|---|---|---|
| CN | 1869280 A | 11/2006 |
| EP | 0984075 A1 | 3/2000 |

(Continued)

OTHER PUBLICATIONS

Machine Translation JP 2008-138225 dated Jun. 2008.*
(Continued)

*Primary Examiner* — Rodney McDonald
(74) *Attorney, Agent, or Firm* — Weaver Austin Villeneuve & Sampson LLP; Brian D. Griedel (57) ABSTRACT

The present disclosure concerns sputter targets and sputtering methods. In particular, sputter targets and methods of sputtering using conventional sputter targets as well as sputter targets described herein, for highly uniform sputter deposition, are described.

9 Claims, 9 Drawing Sheets

(56) References Cited

U.S. PATENT DOCUMENTS

| | | | |
|---|---|---|---|
| 5,507,897 A | 4/1996 | Campet et al. | |
| 5,632,869 A | 5/1997 | Hurwitt et al. | |
| 5,814,195 A | 9/1998 | Lehan et al. | |
| 5,830,336 A | 11/1998 | Schulz | |
| 5,836,506 A | 11/1998 | Hunt et al. | |
| 6,039,850 A | 3/2000 | Schulz | |
| 6,039,855 A | 3/2000 | Wollenberg | |
| 6,074,279 A | 6/2000 | Yoshimura et al. | |
| 6,270,633 B1 | 8/2001 | Onaka et al. | |
| 6,344,117 B2 | 2/2002 | Enomoto et al. | |
| 6,582,572 B2 | 6/2003 | McLeod | |
| 6,599,405 B2 | 7/2003 | Hunt et al. | |
| 6,749,103 B1 | 6/2004 | Ivanov et al. | |
| 7,114,643 B2 | 10/2006 | Ivanov et al. | |
| 7,146,703 B2 | 12/2006 | Ivanov | |
| 7,467,741 B2 | 12/2008 | Wickersham, Jr. et al. | |
| 7,721,939 B2 | 5/2010 | Facey et al. | |
| 9,334,557 B2 | 5/2016 | Neudecker et al. | |
| 2004/0074770 A1 | 4/2004 | Wityak et al. | |
| 2005/0092604 A1 | 5/2005 | Ivanov | |
| 2006/0266638 A1* | 11/2006 | Hosokawa | C23C 14/3407 204/192.1 |
| 2006/0266639 A1* | 11/2006 | Le | C23C 14/3407 204/192.1 |
| 2006/0272936 A1 | 12/2006 | Yamashita et al. | |
| 2007/0039817 A1 | 2/2007 | Daniels et al. | |
| 2007/0074969 A1* | 4/2007 | Simpson | C23C 14/3407 204/192.1 |
| 2010/0108500 A1 | 5/2010 | Hawrylchak et al. | |
| 2010/0245973 A1 | 9/2010 | Wang et al. | |
| 2011/0005924 A1 | 1/2011 | Schnappenberger et al. | |
| 2011/0031117 A1 | 2/2011 | Kim et al. | |
| 2012/0152727 A1 | 6/2012 | Kwak et al. | |
| 2013/0161188 A1 | 6/2013 | Linsbod | |
| 2014/0138242 A1 | 5/2014 | Neumann et al. | |

FOREIGN PATENT DOCUMENTS

| | | | |
|---|---|---|---|
| JP | S62-149866 A | | 7/1987 |
| JP | 63-143258 A | | 6/1988 |
| JP | 63-223168 | * | 9/1988 |
| JP | H04-173966 A | | 6/1992 |
| JP | H06-220628 A | | 8/1994 |
| JP | H07-042582 B2 | | 5/1995 |
| JP | 2003-183822 A | | 7/2003 |
| JP | 2005-113267 A | | 4/2005 |
| JP | 2008-138225 | * | 6/2008 |
| JP | 2008-138225 A | | 6/2008 |
| WO | WO2006/127221 A2 | | 11/2006 |
| WO | WO 2012/145702 A2 | | 4/2012 |
| WO | WO2012/138498 | | 10/2012 |
| WO | WO 2013/003065 A2 | | 1/2013 |
| WO | WO2015/089533 | | 6/2015 |

OTHER PUBLICATIONS

PCT International Search Report dated Nov. 5, 2012 issued in PCT/US2012/034556.
US Office Action dated Nov. 3, 2015 in U.S. Appl. No. 14/112,909.
CN Office Action dated Nov. 6, 2015 for CN Application No. 201280037352.3.
US Final Office Action dated Jun. 8, 2016 in U.S. Appl. No. 14/112,909.
US Office Action dated Oct. 28, 2016 in U.S. Appl. No. 14/112,909.
EP Office Action dated Mar. 9, 2016 for EP Application No. 12774507.3.
CN Office Action dated Mar. 17, 2016 for CN Application No. 201280037352.3.
CN Decision of Rejection dated Oct. 17, 2016 for CN Application No. 201280037352.3.
PCT International Search Report dated Feb. 18, 2013 issued in PCT/US2012/042514.
International Preliminary Report on Patentability dated Jan. 16, 2014 issued in PCT/US2012/042514.
EP Extended Search Report dated Jul. 3, 2014 for EP Application No. 12774507.3.
CN Office Action dated Mar. 23, 2015 for CN Application No. 201280037352.3.
EP Extended Search Report dated Oct. 9, 2014 for EP Application No. 12804836.0.
U.S. Notice of Allowance dated May 10, 2017 in U.S. Appl. No. 14/112,909.
EP Office Action dated May 16, 2017 for EP Application No. 12774507.3.
EP Office Action dated Mar. 23, 2017 for EP Application No. 12804836.0.

* cited by examiner

SPUTTER TARGET AND SPUTTERING METHODS

CROSS-REFERENCE TO RELATED APPLICATIONS

This is a national stage application under 35 U.S.C. §371 to International Application Number US2012/042514 (designating the United States), filed on Jun. 14, 2012 and titled "SPUTTER TARGET AND SPUTTERING METHODS," which claims benefit of U.S. Provisional Application Ser. No. 61/503,547, filed on Jun. 30, 2011 and titled "SPUTTER TARGET AND SPUTTERING METHODS," both of which are hereby incorporated by reference in their entirety and for all purposes.

FIELD

The present disclosure concerns sputter targets. In particular, sputter targets and methods of sputtering using conventional sputter targets as well as sputter targets described herein, for highly uniform sputter deposition, are described.

BACKGROUND

Sputtering is a process where a solid target material is bombarded with energetic particles and, as a result, atoms of the target material are ejected from the target. Sputtering is commonly used for thin-film depositions in many high-tech applications. Commonly, an argon plasma is used to sputter material from a target and deposit the material on a substrate.

As sputter technology improves, many industries are moving toward larger area substrates upon which thin film depositions are carried out. For example, in the semiconductor industry, processing larger semiconductor wafer substrates provides higher yield of dies used to make computer chips and related circuitry devices. In another example, thin film coatings are used on large format glass substrates for solar cells and windows having high-tech coatings, such as electrochromic devices made of a stack of deposited materials on a glass or other transparent substrate used to make electrochromic (EC) windows. Many such applications require highly-uniform coatings in order to make solar or electrochromic devices that perform well. As technology advances, such coatings become thinner and thinner and thus uniformity of the layers making up such coatings must be commensurately higher.

Non-uniformity of a sputter deposited layer becomes more of an issue with the use of larger substrates because it is a challenge to coat a large area with a consistently high uniformity. For example, the morphology, coverage and/or thickness of the deposited material may be different in different areas of the substrate. These variations may be due to corresponding variations in plasma density, which in some instances can correlate to non-uniformity in the sputter target and/or the use of sectioned sputter targets.

SUMMARY

Embodiments described herein include sputter targets and methods of sputtering. One embodiment is a sputter target assembly including: (a) a backing support; and (b) two or more sputter target sections assembled on the backing support, the assemblage of the two or more sputter target sections defining a target area which includes at least one gap or seam between the two or more sputter target sections.

The two or more sputter target sections are configured so that there is no line of sight between any of the two or more sputter target sections, in a direction orthogonal to the surface of the backing support, from the backing support to the front of the two or more sputter target sections. That is, the substrate upon which sputter deposition is performed, from a perspective of looking directly (orthogonal to a plane parallel to the sputter target and/or substrate, since they are substantially parallel during sputtering) at the sputter target assembly does not "see" the backing support as it passes by the sputter target assembly. In some embodiments, the backing support can be a backing plate (e.g., for planar sputter target assemblies) or a backing tube (e.g., for cylindrical sputter target assemblies). In various embodiments the two or more sputter target sections are configured such that they do not physically touch each other, but have overlapping edge regions that prevent a line of sight from a direction orthogonal to the backing support, and/or the substrate and/or the sputter target sections' sputter surfaces. In certain embodiments, there is no line of sight, from any angle in a plane perpendicular to the sputter surface or a plane perpendicular to the longitudinal axis of a cylindrical target assembly, between the two or more sputter target sections to the backing support.

Various embodiments include sputter target assemblies having two or more sputter target sections include a material used to sputter deposit nickel tungsten oxide. This material may include a nickel tungsten alloy and/or a sintered nickel tungsten composite.

Certain embodiments include methods of sputter depositing materials onto substrates. One such embodiment is a method of sputter depositing a material onto a substrate when using a sputter target assembly including two or more sputter target sections, the method including: (a) providing the substrate in a sputter chamber; and (b) passing the substrate past the sputter target assembly while sputtering the material onto the substrate's work surface; wherein the two or more sputter target sections are configured so that substantially all of the work surface of the substrate is exposed to the same ratio of sputter target surface area to any non-sputter target area and/or seams between the two or more sputter target sections to which the substrate is exposed during sputter deposition.

Another embodiment is a method of sputter depositing a material onto a substrate when using a sputter target assembly including two or more sputter target sections, the method including: (a) providing the substrate in a sputter chamber; and (b) passing the substrate past the sputter target assembly while sputtering the material onto the substrate's work surface. The two or more sputter target sections are configured so that substantially all of the work surface of the substrate is exposed to the same ratio of emissivities that make up the range of emissivities of the sputter target assembly's target area during sputter deposition.

Another embodiment is a method of sputter depositing a material onto a substrate when using a sputter target assembly including two or more sputter target sections, the method including: (a) providing the substrate in a sputter chamber; and (b) passing the substrate past the sputter target assembly while sputtering the material onto the substrate's work surface. The two or more sputter target sections are arranged on a backing support and any exposed areas of the backing support in the sputter target assembly's target area are coated with a material having substantially the same emissivity as the two or more sputter target sections such that the work surface of the substrate is exposed to substantially the same emissivity from two or more sputter target sections and the exposed areas of the backing support.

Sputter assemblies as described can be used in the methods described herein. These and other embodiments are described in more detail below.

DETAILED DESCRIPTION

Non-Uniformity in Sputter Depositions

Non-uniformity in sputter deposited materials can arise in many ways. For example, non-uniformity in a sputter deposited material can arise from non-uniformities in the surface of the sputter target, parasitic plasma forming in areas around the sputter target and or individual sections of a sputter target if the target includes such sections, non-uniformities in the material making up the sputter target, and the like. Although these are all important considerations, for the purposes of this description, the primary focus is on non-uniformities in sputter deposited materials due to exposure to a sputter target assembly that includes two or more sputter target sections that make up the sputter target assembly. Specifically, these sputter target sections are typically assembled on a backing support where there is some separation between the target individual sections, as there are typically some tolerances allowed for ease of installation of the target sections. Even if the target sections are abutted together, there may be some non-uniformity in the sputter target surface where the target sections meet. Thus, these seams between sputter targets, whether a small gap or no gap, create a target area that may not be completely or highly uniform with respect to uniformity requirements of sputter coatings on the order of nanometers thick.

Embodiments herein are described in terms of electrochromic (EC) window technology, for example, sputter depositing a material from a sputter target assembly onto a glass substrate, which may have one or more layers already deposited thereon, in order to form a layer of an EC device on the glass substrate. This is for convenience only. Embodiments described herein are not limited to any particular device technology or substrate; rather, the embodiments described herein are applicable to any sputter deposition process where a highly uniform deposition of the sputtered material is desired. In order to understand some of the issues that are addressed by the embodiments described herein, a description of a typical sputter target assembly is shown in FIGS. 1A-1C.

Figure 1A:
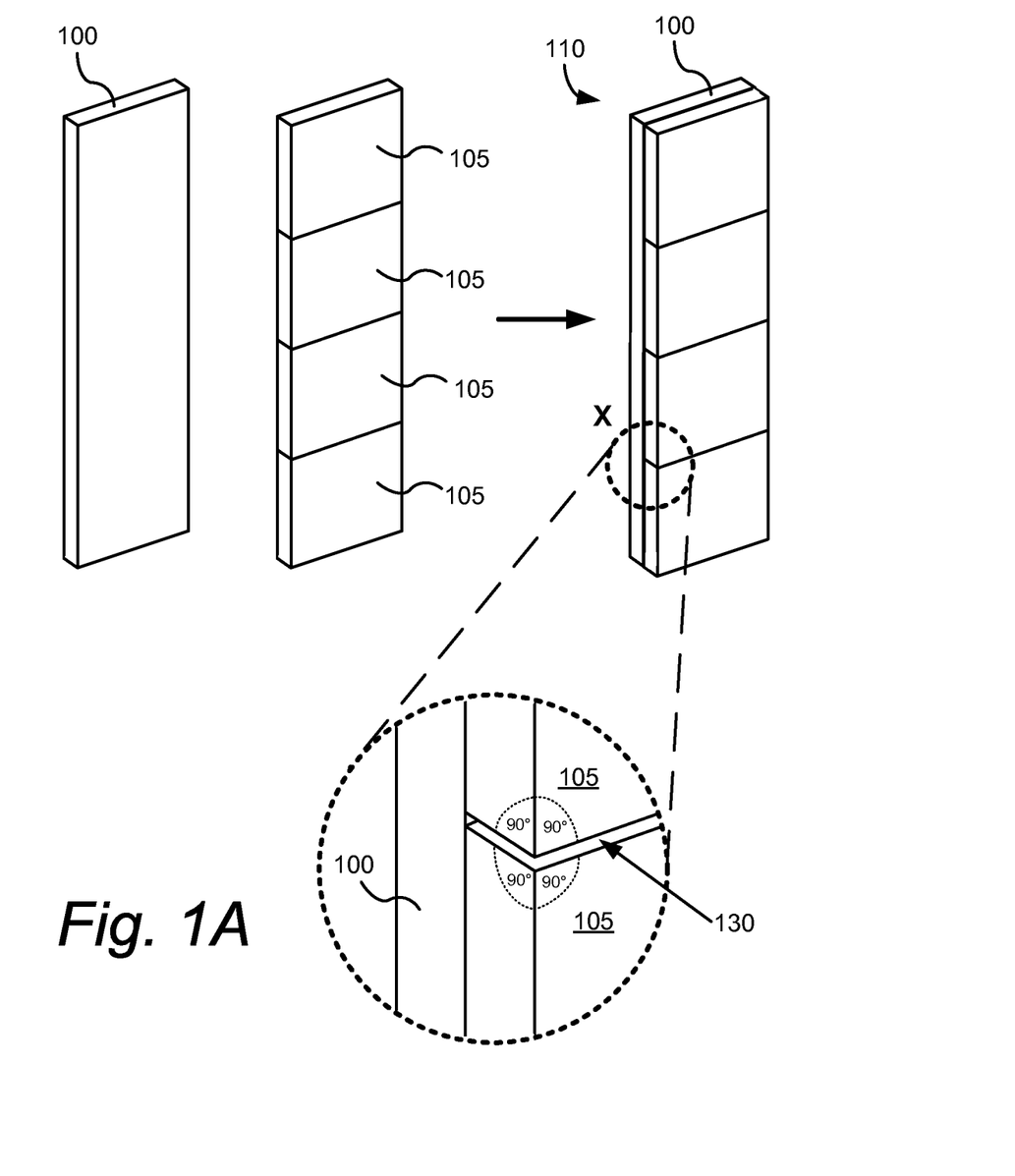
FIGS. 1A and 1B are perspectives of a sputter target assembly.
Figure 1B:
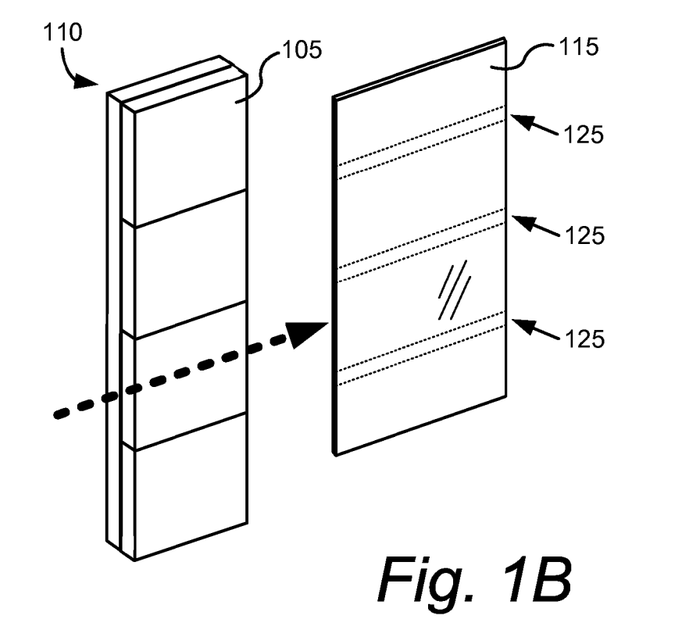
Figure 1C:
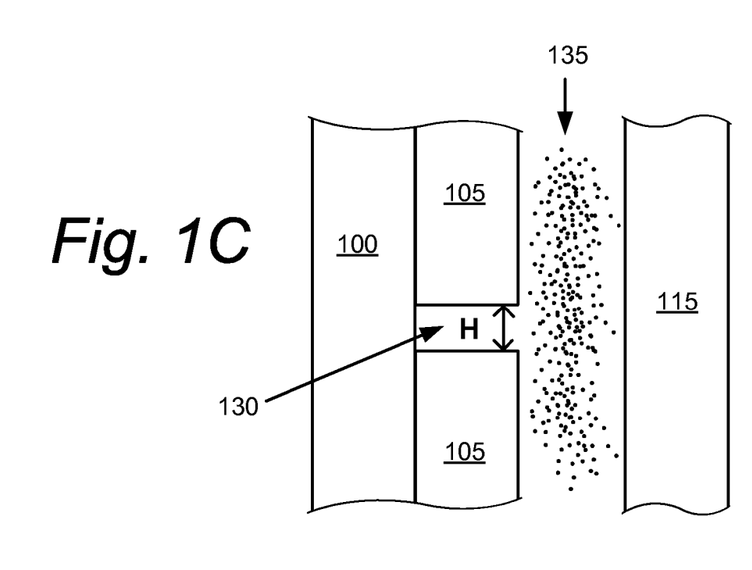
FIG. 1C is a section of a side view of the sputter target assembly as described in relation to FIGS. 1A and 1B.

FIG. 1A depicts, in perspective, a typical (planar) sputter target assembly, 110, having a backing plate, 100, to which are attached a number of sputter target segments (or tiles), 105. In this example there are four sputter target segments, 105, that are affixed or otherwise assembled on backing plate 100. Backing plate 100 is typically bolted or otherwise affixed to a cathode (not shown). In certain embodiments, the backing support also functions as the cathode and/or is part of a cathode. In one example, the sputter target segments may be a nickel tungsten alloy or a nickel tungsten sintered material, used to sputter, for example, nickel tungsten oxide by sputtering the target in the presence of oxygen. This is only a representative material for the purposes of the discussion. Virtually any sputter material is applicable to issues that the apparatus and methods described herein were developed to address. Examples of suitable sputter materials include W, Mo, V, Ti, Ni, Cu, Al, Si, Ta, and Nb, including alloys, compounds, oxides and nitrides thereof of each, and including materials such as indium tin oxide, aluminum zinc oxide, indium zinc oxide, Li, and Li compounds.

As assembled on sputter target assembly 110, sputter target sections 105 are positioned closely to, and registered with, one another. Target assemblies such as 110 are used, for example, when sputter coating larger substrates, i.e., where it is inconvenient or impracticable to have a monolithic target, but rather an assemblage of target sub-sections that collectively make a larger target surface area. In the examples described herein, a backing support is always depicted behind the sputter target material such that parasitic plasmas that might be formed around the perimeter of the sputter target and near the backing support are minimized. Sputter target sections 105 may be touching or, as depicted in FIG. 1A, they may have a gap, 130, between them to account for ease of assembling the target sections onto the backing plate and/or to account for thermal expansion during sputtering and the like.

As depicted in the expanded section, X, in FIG. 1A, in this example, sections 105 have a rectangular area and cross-section. The gap between sections 105 may be very small, on the order of millimeters or less than a millimeter. Nonetheless, this gap can cause non-uniformity issues in a sputtered deposited film on a substrate. An example of this non-uniformity is illustrated in FIG. 1B. FIG. 1B depicts sputter target assembly 110, again in perspective as in FIG. 1A. In this depiction, a transparent substrate, 115, for example a large format glass substrate such as architectural glass, is passed by sputter target assembly 110 during a sputter deposition operation. Depending on the particular deposition, one or more of target assemblies 110 may be positioned in line for more efficient sputter coverage of the working surface of substrate 115 which faces sputter target sections 105. Because of the seams and/or gaps between sputter target sections 105, there are formed regions, 125, of non-uniformity in the sputter deposited film on the work surface of substrate 115. Regions 125 approximate the shape and orientation of the seams between sputter target sections 105, because substrate 115 was passed directly over these seams during sputter deposition.

Regions 125 may represent thickness variations due to less sputtered particle density near the seams between sputter target sections 105 and/or density variations in the film and/or other uniformity issues. It has been observed that when electrochromic devices are fabricated using sputter targets such as target assembly 110, regions 125 are apparent when the EC device transitions from a bleached state to a colored state. Thus, it is apparent that there is some difference in the quality of the film in regions 125 (that corresponds to the seams between the sputter target sections) as compared to the remainder of the EC film.

While not wishing to be bound by theory, it is believed that the non-uniform regions may be formed by differences in emissivity of the sputter target material and the backing plate areas in the seams that are exposed. The emissivity of a material (usually written $\epsilon$ or e) is the relative ability of the material's surface to emit energy by radiation. It is the ratio of energy radiated by a particular material to energy radiated by a theoretical black body (at the same temperature). That is, a black body would have an $\epsilon=1$, while any real object would have an $\epsilon<1$. In general, the duller and blacker a material is, the closer its emissivity is to 1. The more reflective a material is, the lower its emissivity. As an example, highly polished silver has an emissivity of about 0.02. The emissivity as it may relate to deposited layer non-uniformity is explained in more detail in relation to FIG. 1C.

FIG. 1C depicts a side view section of sputter target assembly 110 in the region where gap 130 resides. Although not drawn to scale, FIG. 1C depicts particles, 135, of sputtered material from target sections 105 in the area between the target sections and substrate 115 during deposition. Because gap 130 has a height, H, there is a direct (orthogonal to the backing plate major surface on which the sputter target sections are assembled) line of sight between a portion of backing plate 100 in gap 130 and substrate 115. In this example, target sections 105 are made from a metal or alloy, such as sintered nickel tungsten or nickel tungsten alloy, which is highly reflective and thus has a low emissivity. At the same time, backing plate 100 is made of a material that has a much different emissivity, for example, such as copper alloy or other material. It is believed that the emissivity difference between the target sections and the backing plate may account, at least in part, to the formation of regions 125 in the deposited film. In certain embodiments, the surface of a backing support that is exposed is coated with a material having an emissivity that approximates the emissivity of the sputter target material. In relation to FIG. 1C, this would be the exposed portion of backing plate 100, in gap 130.

When using more than one sputter target assembly such as assembly 110, it is helpful to stagger or offset the seams between the assemblies so that when a substrate passes over the target assemblies the seams of each sputter target assembly are not aligned each other. However, this does not solve the non-uniformity issue nor address the line of sight issue directly. In certain instances, one could simply use a sputter target having a unitary body, i.e. not comprised of sputter target sections. However, with larger and larger area substrates being used, this becomes impractical; in many cases due to physical and material constraints, for example, sintering and pressing large area sputter targets may not be feasible. Embodiments herein are directed to sputter target assemblies having two or more sputter target sections assembled to create a sputter target assembly "target area" which includes the (sputter) surface area of each of the sputter target sections and any seams or spaces in between adjoining or proximate sputter target sections.

Sputter Target Assemblies

Figure 2A:
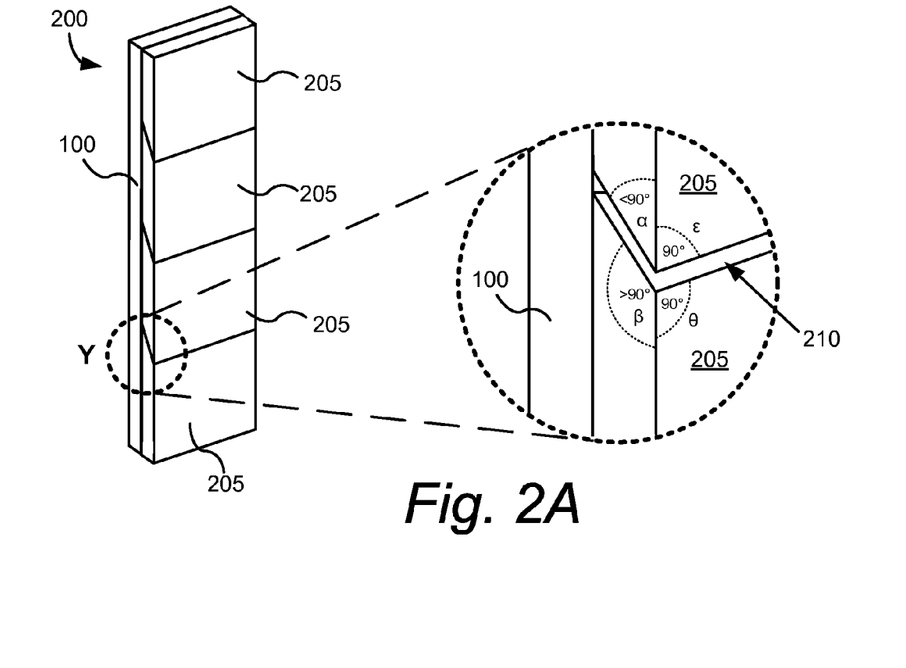
FIG. 2A is a perspective of a sputter target assembly.

FIG. 2A depicts a sputter target assembly, 200, in perspective. Sputter target assembly 200 also includes backing plate 100. However, assembly 200 also includes sputter target sections, 205, which are configured to prevent the aforementioned line of sight between the backing plate and the substrate during sputter deposition. As depicted in the expanded section, Y, of FIG. 2A, there is still a gap, 210, between the sputter target sections 205, but in this example, the edges of the sections that are proximate one another to form gap 210 are shaped so that portions of segments 205 overlap. In this example, non-90 degree angles, $\alpha$ and $\beta$, are used at the edges of segments 205 so that one edge can pass over another edge and block a direct orthogonal line of sight between backing plate 100 and substrate 115. This is illustrated in FIG. 2A. The sputter surface (face) of the target sections is rectangular, as evidenced by angles $\epsilon$ and $\theta$ which are 90 degrees.

Figure 2B:
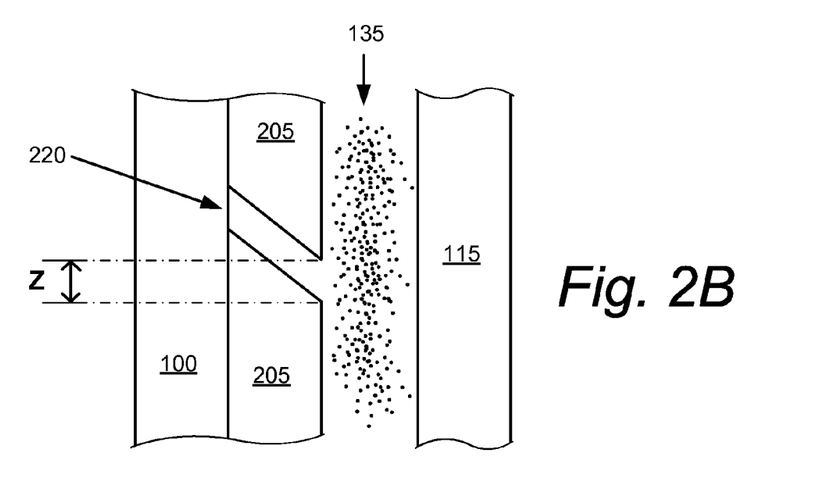
FIG. 2B is a section of a side view of the sputter target assembly as described in relation to FIG. 2A.

FIG. 2B depicts a side view section of sputter target assembly 200 in the region where gap 210 resides. Although not drawn to scale, FIG. 2B depicts particles, 135, of sputtered material from target sections 205 (in this example made from the same material as target sections 105) in the area between the target sections and substrate 115 during deposition. Although gap 210 has a height, Z, there is not a direct (orthogonal) line of sight between a portion, 220, of backing plate 100 in gap 210 and substrate 115. Thus, from a viewpoint orthogonal to the work surface of substrate 115 that faces sputter target sections 205, substrate 115 "sees" a continuous sputter target surface, even though gap 210 exists.

In the example depicted in FIGS. 2A and 2B, the angle $\alpha$ is less than 90 degrees and the angle $\beta$ is greater than 90 degrees. In this particular example, the angles are complementary angles; however this need not be so. Also, the edges of sputter target sections 205 are depicted as linear, but this need not be so. As well, the sputter surfaces of the target sections are drawn as planar, and co-planar to each other; this is only an example. One of ordinary skill in the art would appreciate that there a number of different configurations for sputter target sections to have at least some overlapping regions such that a backing support is not exposed or the exposure is minimized (i.e., having no orthogonal line of sight between backing support and substrate deposition surface). Depending upon the sputter plasma density variation, the sputter surfaces of the target sections may also not be co-planar. In the examples described herein, they are substantially planar and substantially co-planar. As such, one of ordinary skill in the art would also appreciate that there are a vast number of edge configurations that can be envisioned for removing any orthogonal line of sight as described above. Some of these configurations are exemplified in FIG. 3A.

Figure 3A:
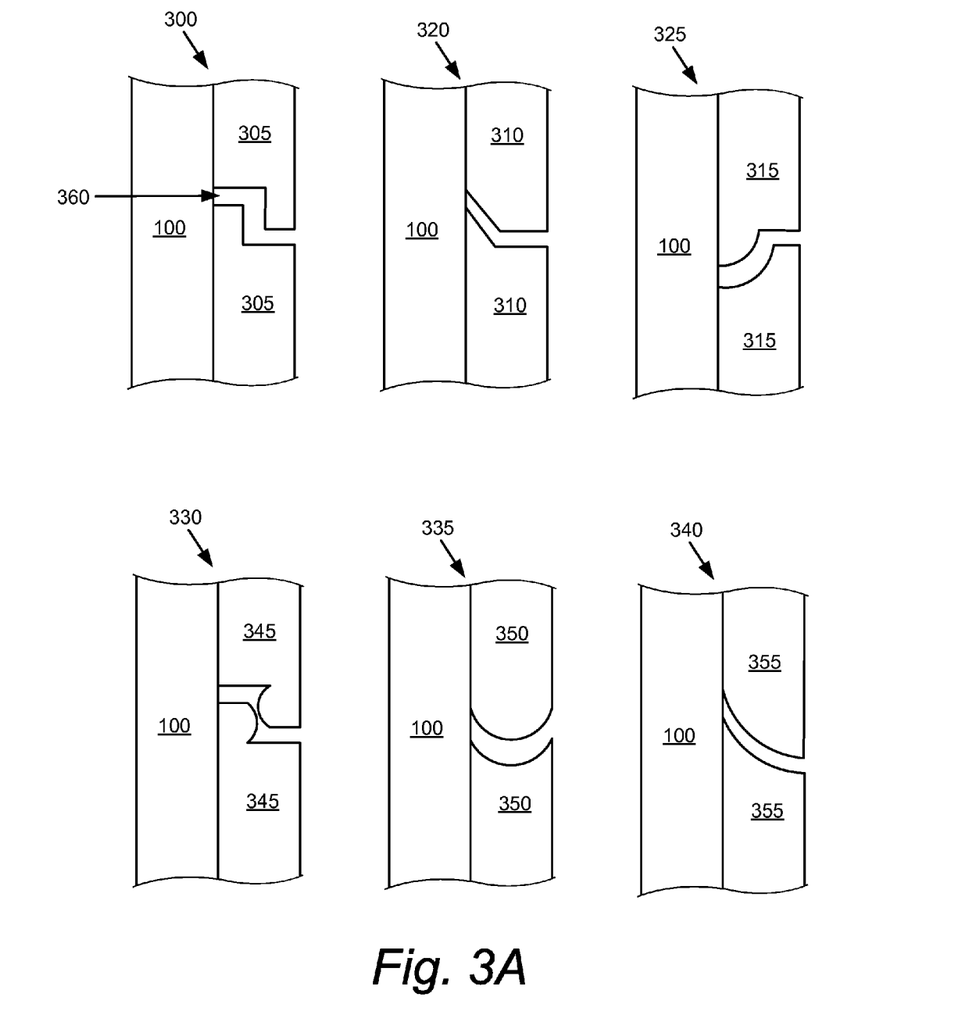
FIG. 3A depicts sections of side views of a number of sputter target assemblies.

FIG. 3A depicts a number of side view sections of gap regions, between sputter target sections on backing plate 100. For example, sputter target assembly 300 includes sputter target sections 305. Each of sputter target sections 305 has at least one overlapping edge portion with the other target sections. In this example, the overlapping edge portions are formed by using 90 degree angles. The gap, 360, between sputter target sections 305 is a circuitous path that prevents an unobscured line of sight (orthogonal or otherwise) between backing plate 100 and a deposition substrate (not shown) that would oppose the sputter target surfaces. Side view section of sputter target assembly 320 shows sputter target sections 310 that also prevent direct line sight between backing plate 100 and a deposition substrate. As exemplified by side view sections of sputter target assemblies 325 and 330, the overlapping edge portions of the sputter target sections, 315 and 345, respectively, can include both linear and curved portions to create a path that prevents an unobscured line of sight. The dimensions of the gap between the sputter target sections can be as little as less than 1 mm or larger than a 1 mm, for example a few millimeters or more, and the gap need not be uniform throughout the path from the surface of backing support (e.g., backing plate 100) and the opening of the gap at the surface of the sputter target sections (e.g., as depicted in the side view section of sputter target assembly 330). As exemplified by side view sections of sputter target assemblies 335 and 340, the overlapping edge portions of the sputter target sections, 350 and 355, respectively, can include only curved portions to create a path that prevents an unobscured line of sight.

Figure 3B:
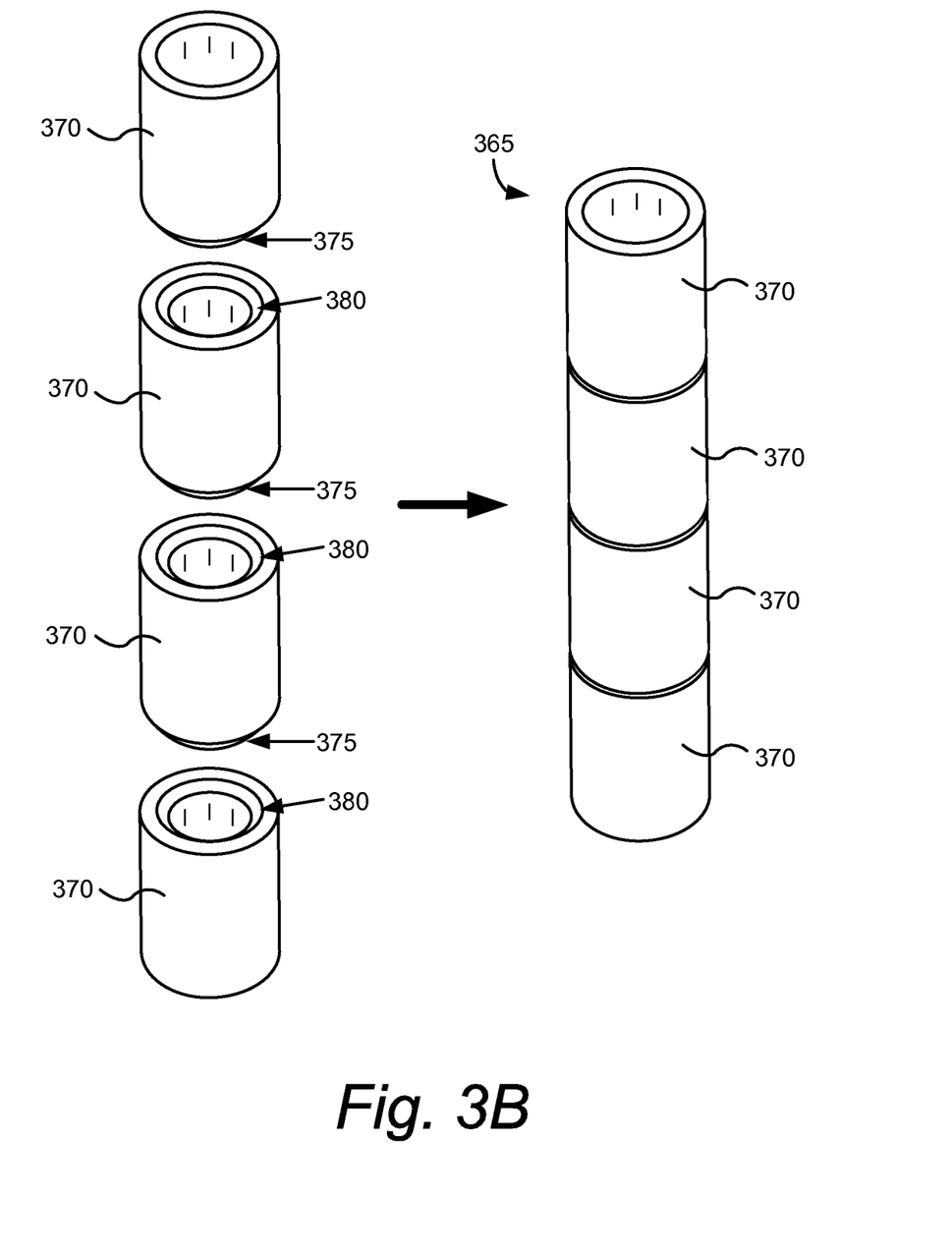
FIG. 3B are perspectives of a cylindrical sputter target assembly.

Sputter targets are not always planar. Embodiments described herein also apply to non-planar targets, i.e., targets having curved surfaces, for example cylindrical targets. FIG. 3B depicts a sputter target assembly, 365, which includes sputter target sections, 370. In this example, sputter target assembly 365 is circular cylindrical (another example would be an ellipsoidal cylindrical sputter target assembly). Typically such a cylindrical sputter target assembly includes a backing support, such as a backing tube (not depicted), upon which the sputter target sections 370 are assembled. Other components may include magnets, cathode components and the like for producing a plasma (not shown). In this example, sputter target sections 370 are configured so that when they are assembled on the backing support the edges that are proximate to each other overlap as described in relation to, for example, FIGS. 2A and 2B and/or FIG. 3A. In this example, target sections 370 may have a protruding lip, 375, that is inserted into a depression, 380, on a neighboring target section. The target sections may or may not come in contact when assembled (e.g., a spacer may be used between sections 370). In this example, they do not come in direct contact when assembled, so their cross section when assembled looks much like the cross section of assembly 325 in FIG. 3A (where the backing tube would correspond to backing plate 100). Thus, the overlapping portions of sputter target sections 370 prevent an unobscured line of sight between the backing support and a substrate (not shown) during sputter deposition. One of ordinary skill in the art would appreciate that, like the planar target sections described in relation to FIGS. 2A and 2B and/or FIG. 3A, the overlapping sections may have any number of configurations, e.g., as described in relation to FIG. 3A.

Thus, in accord with the description above, one embodiment is a sputter target assembly including: (a) a backing support; and (b) two or more sputter target sections assembled on the backing support. The two or more sputter target sections are configured so that there is not a direct orthogonal line of sight between the surface of the backing support on which the two or more sputter target sections are assembled and a substrate work surface during sputter deposition. In one embodiment, the backing support is a backing plate and where each of the two or more sputter target sections: i) is affixed to the backing plate; and ii) has a substantially planar sputter surface, substantially co-planar with the other section or sections of the two or more sputter target sections. In one embodiment, the two or more sputter target sections are configured such that they do not touch each other, but have overlapping edge regions that prevent the direct orthogonal line of sight between the surface of the backing support on which the two or more sputter target sections are assembled and a substrate work surface during sputter deposition. In one embodiment, at least one spacer is used between target sections to prevent the target sections from touching each other. In certain embodiments, there is no unobscured line of sight between the surface of the backing support on which the two or more sputter target sections are assembled and a substrate work surface during sputter deposition.

In one embodiment, the backing support is a backing tube and the two or more sputter target sections are each cylindrical sleeve segments. The cylindrical sleeve segments may be configured such that they do not physically touch each other, but have overlapping edge regions that prevent the direct orthogonal line of sight between the surface of the backing tube on which the two or more sputter target sections are assembled and a substrate work surface during sputter deposition. In certain embodiments, there is no unobscured line of sight between the surface of the backing support on which the two or more sputter target sections are assembled and a substrate work surface during sputter deposition.

As mentioned, in some embodiments, the two or more sputter target sections include a material used to sputter deposit nickel tungsten oxide. This material may be a nickel tungsten alloy or a sintered nickel tungsten composite. Such composites can be formed, for example, by hot isostatic pressing of nickel and tungsten particles. These sputter target materials apply to all embodiments described herein, be they method or apparatus embodiments.

Target Configurations to Address Non-Uniformity

Methods described herein include using target assemblies having conventional gaps where a backing support has a direct orthogonal line of sight with the substrate during sputter deposition, and/or using the sputter target assemblies described herein.

As described above, when using conventional sputter target assemblies, it is apparent that there is some difference in the quality of deposited EC films in regions that correspond to the seams or gaps between the sputter target sections as compared to the remainder of the EC film. Further, as described above, while not wishing to be bound by theory, it is believed that the non-uniform regions may be formed by differences in emissivity of the sputter target material and the backing plate areas that are exposed in the seams.

Thus, one embodiment is a method of sputter depositing a material onto a substrate when using a sputter target assembly including two or more sputter target sections, the method including: (a) providing the substrate in a sputter chamber; and (b) passing the substrate past the sputter target assembly while sputtering the material onto the substrate's work surface. The two or more sputter target sections are configured so that substantially all of the work surface of the substrate is exposed to the same ratio of emissivities that make up the range of emissivities of the sputter target assembly's target area during sputter deposition.

As described above, in certain embodiments, the surface of a backing support that is exposed is coated with a material having an emissivity that approximates the emissivity of the sputter target material.

Figure 4A:
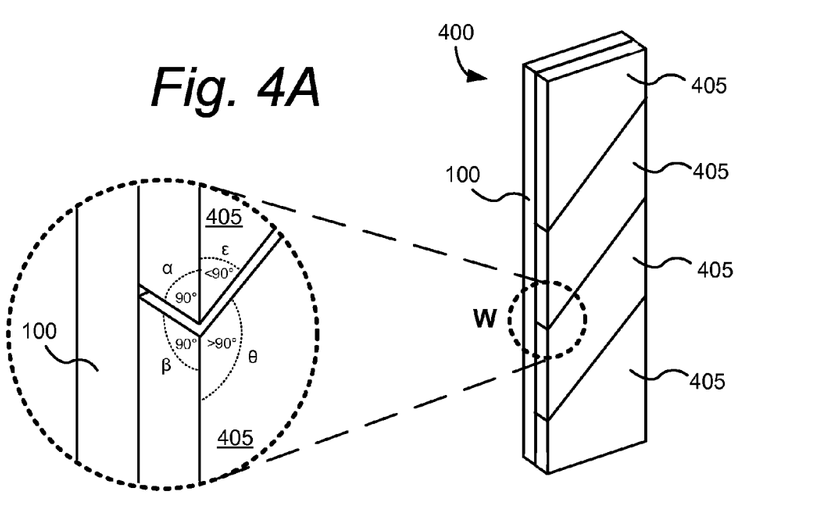
FIGS. 4A-4H are perspectives of various sputter target assemblies.
Figure 4B:
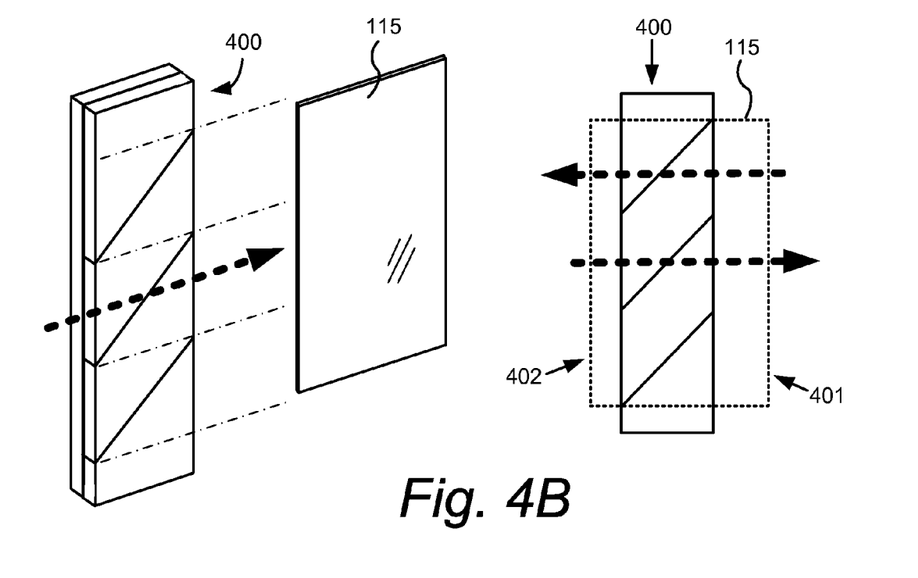

Another embodiment is a method of sputter depositing a material onto a substrate when using a sputter target assembly including two or more sputter target sections, the method including: (a) providing the substrate in a sputter chamber; and (b) passing the substrate past the sputter target assembly while sputtering the material onto the substrate's work surface. The two or more sputter target sections are arranged on a backing support and any exposed areas of the backing support in the sputter target assembly's target area are coated with a material having substantially the same emissivity as (or approximates the emissivity of) the two or more sputter target sections such that the work surface of the substrate is exposed to substantially the same emissivity from two or more sputter target sections and the exposed areas of the backing support. Again, for reference to an example, in relation to FIG. 1C, the portion of backing plate 100, in gap 130, is coated with a material having an emissivity that approximates that of target sections 105. These methods are applicable whenever there is a line of sight to the backing plate between the target sections, for example, the backing plate in assembly 400, as described in relation to FIGS. 4A and 4B, is coated with a material having an emissivity that approximates that of target sections 405.

Whatever the reason underlying the variation in sputter deposited film uniformity, be it emissivity, plasma density variation, sputter target thickness, etc., it is clear that the non-uniformities correspond to, and therefore can be correlated to, the gaps and/or seams between the sputter target sections. Thus, another and/or an additional way to address non-uniformity in a sputter target assembly's target area, such as gaps and/or seams, is to configure the sputter target sections of the assembly so that when a substrate passes over the target area, all areas of the substrate upon which deposition are to occur are exposed to substantially the same ratio of sputter target section surface area to area of any seams and/or gaps in the target area.

Thus, one such embodiment is a method of sputter depositing a material onto a substrate when using a sputter target assembly including two or more sputter target sections, the method including: (a) providing the substrate in a sputter chamber; and (b) passing the substrate past the sputter target assembly while sputtering the material onto the substrate's work surface. The two or more sputter target sections are configured so that substantially all of the work surface of the substrate is exposed to the same ratio of sputter target surface area to any non-sputter target area and/or seams between the two or more sputter target sections to which the substrate is exposed during sputter deposition.

Methods described herein can be applied to the sputter target assemblies described herein or conventional sputter target assemblies. For the purposes of this description, "passing the substrate past the sputter target assembly while sputtering the material onto the substrate's work surface" is meant to encompass the relative motion between a substrate and a target assembly during sputter. This includes moving the substrate past a stationary sputter target, moving both the sputter target and the substrate past each other, and the like. In a particular embodiment, the substrate is moved back and forth past a stationary sputter target during sputter deposition for multiple passes in order to deposit a material layer on the substrate work surface. This is sometimes referred to as a "cha-cha" movement of the substrate past the sputter target, i.e., a reciprocating translational movement. In certain embodiments, cylindrical targets are used. In the context of cylindrical targets, "passing the substrate past the sputter target assembly while sputtering the material onto the substrate's work surface" is meant to include rotating the cylindrical sputter assembly about its longitudinal axis and moving the substrate past the cylindrical sputter target assembly and/or translating the cylindrical sputter assembly past the substrate work surface during sputter deposition.

FIG. 4A depicts a sputter target assembly, 400, configured to carry out methods described herein. Assembly 400 includes backing plate 100, upon which are assembled sputter target sections 405. The expanded section (indicated by the dotted circle W) shows that, although the gap between target sections 405 does permit a direct orthogonal line of sight between backing plate 100 and substrate 115 (see FIG. 4B), by virtue of angles α and β being 90 degrees, and the target sections have angled edges on their face, by virtue of angle ε being less than 90 degrees and angle θ being greater than 90 degrees.

Thus, the gaps between sputter target sections 405 are angled with respect to the perimeter sides of the target assembly.

Referring to FIG. 4B, target sections 405 are configured so that ratio of the target surface area to gap or seam area that the substrate is exposed to during deposition is substantially the same for all areas of the substrate as the substrate passes the sputter target assembly. Thus, during deposition, the entire deposition area of the substrate "sees" substantially the same area of sputter target material as gap. In this example the bottom of one seam and the top of the next seam are configured along a horizontal line so that the portion of substrate 115 that passes along that theoretical line sees essentially a single gap (as does the remainder of the substrate area as it passes the target assembly). Thus, sputter target assemblies described herein include sputter target sections that have a conventional gap (one that allows orthogonal line of sight between backing support and substrate during sputter deposition), but that include two or more sputter target sections configured so that substantially all of the work surface of the substrate is exposed to the same ratio of sputter target surface area and any non-sputter target area and/or seams between the two or more sputter target sections during sputter deposition. The latter portion of FIG. 4B (front view of substrate passing in front of sputter target assembly) depicts the "cha-cha" movement as indicated by the heavy dashed arrows. That is, substrate 115 is sometimes translated back and forth in front of the sputter target during sputter deposition.

Embodiments where the two or more sputter target sections are configured so that substantially all of the work surface of the substrate is exposed to the same ratio of sputter target surface area to any non-sputter target area and/or seams between the two or more sputter target sections to which the substrate is exposed during sputter deposition, effectively negate differences in what the substrate "sees" with respect to sputter target surface as compared to seams or gaps between the sputter target sections. That is, the ratio of sputter target area to seam and/or gap is, or approximates, 1:1.

Referring back to FIG. 1B, areas (swaths) 125 were a result of the horizontal seams between the sputter target sections. More specifically, as substrate 115 passes the seams between sputter target sections 105, by virtue of the path of motion, there are areas on substrate 115 opposite the seams that are exposed only to the seams during the entire sputter process. That is, for these areas of the substrate, the ratio of sputter target surface area to any non-sputter target area and/or seams between the two or more sputter target sections that the substrate sees approximates 0:1, because, at least from an orthogonal point of view, these areas see no sputter target surface area. When one considers that there is likely some sputter plasma between the seam areas of the sputter target assembly and the substrate during sputtering, the substrate does receive some sputter deposition, but the uniformity varies in these areas (e.g., areas 125) as compared to the remainder of the substrate. Thus, by configuring the target sections so that the ratio approximates 1:1, any effects the seam areas have on uniformity are essentially negated because all areas of the substrate see the same amount of seam as they do sputter target surface area.

The effect the seams have on sputter deposition may also be ameliorated to the point where any differences in the uniformity across the substrate are unnoticeable, for example, there is no optical discernation of non-uniformity in an EC device. That is, rather than completely negating any differences in the uniformity due to the seams (by having all areas of the substrate see the same ratio (1:1) of target to seam as described above), in certain embodiments, the effect the seams have on uniformity is ameliorated to some extent. Thus, in certain embodiments, the sputter target sections are configured so that the ratio of sputter target surface area to any non-sputter target area and/or seams between the two or more sputter target sections to which the substrate is exposed during sputter deposition, from an orthogonal point of view, is greater than 0:1 but less than 1:1. In one embodiment, the ratio is between about 0.1:1 and about 0.9:1; in another embodiment, between about 0.25:1 and about 0.75:1, in another embodiment about 0.5:1.

In practice, an example of an embodiment where this is implemented would be where the seams are oriented at some angle, e.g., as depicted in relation to FIG. 4B, but where the bottom of one seam and the top of the next seam are not configured along a horizontal line as described in relation to FIG. 4B. A few such examples are depicted in FIGS. 4E-4H showing target assemblies 450, 460, 470, 480 and 490. For example, referring to FIG. 4E, as substrate 115 passes by target assembly 450, there are areas, 115a, between the dashed lines as indicated, which see no seams. The areas of substrate 115 between these bands 115a are exposed to seams during sputter deposition. Thus, the ratio of sputter target surface area to any non-sputter target area and/or seams between the two or more sputter target sections to which the substrate is exposed during sputter deposition is greater than 0:1, but less than 1:1. Depending upon the sputter conditions, including the material being deposited, the desired thickness, the function of the material, etc., the ratio may need to be, e.g., closer to 1:1, or a much lower ratio will suffice, e.g., as depicted by sputter assembly 460, FIG. 4F. In this example, the pitch (angle from horizontal) of the seams is less than in assembly 450. FIG. 4G depicts sputter target assembly 470, which has curved seams or gaps between sputter target sections. In this example, areas denoted 115b "see" no seams or gap during sputter deposition, while the areas in between do. Assemblies 480 and 490, in FIG. 4H, illustrate that the seams, and therefore the sputter target sections, may take a variety of shapes.

As discussed above, certain embodiments include sputter target assemblies having sputter target sections that have overlapping portions, for example edge portions, that prevent orthogonal, or any, line of sight between the backing support and the substrate during sputter deposition. Such sputter target sections can also be configured so that substantially the entire work surface of the substrate is exposed to the same ratio of sputter target surface area and any non-sputter target area and/or seams between the two or more sputter target sections during sputter deposition. This is exemplified in FIGS. 4C and 4D.

Depending on the deposition requirements, in one embodiment, two or more sputter assemblies as described herein are used during a single sputter deposition on a substrate. In one embodiment, the pattern and spacing of the seams on the two or more sputter targets is the same, in another embodiment, target assemblies having different seam patterns are used in a single sputter deposition. In one example, this is done so that one assembly's seam pattern effect on uniformity is by design used to compensate for non-uniformity imposed by virtue of another sputter target assembly's seam pattern.

Figure 4C:
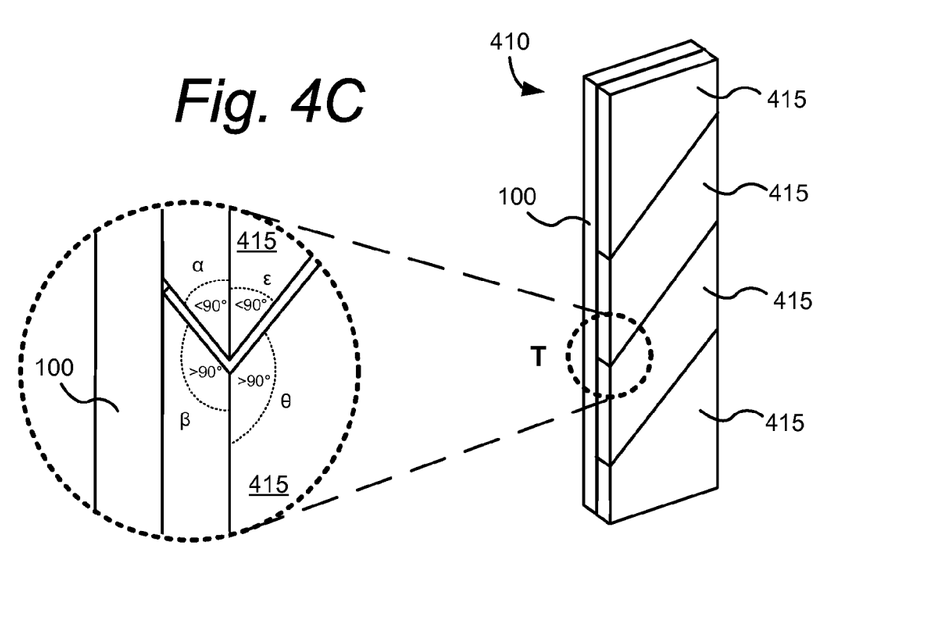

FIG. 4C depicts a sputter target assembly, 410, configured to carry out methods described herein. Assembly 410 includes backing plate 100, upon which are assembled sputter target sections 415. The expanded section (indicated by the dotted circle T) shows that the gap between target sections 415 do not permit a direct orthogonal (e.g., to the target (sputter) surface) line of sight to backing plate 100, by virtue of angles $\alpha$ and $\beta$ being non-90 degree angles. Also, as for target assembly 400, the target sections have angled edges on their face, by virtue of angle $\epsilon$ being less than 90 degrees and angle $\theta$ being greater than 90 degrees. Thus, for sputter target assembly 410, the gaps between sputter target sections 415 are angled with respect to the perimeter sides of the target assembly and they are angled with respect to a plane normal to the target sputter surface and/or the backing plate.

Figure 4D:
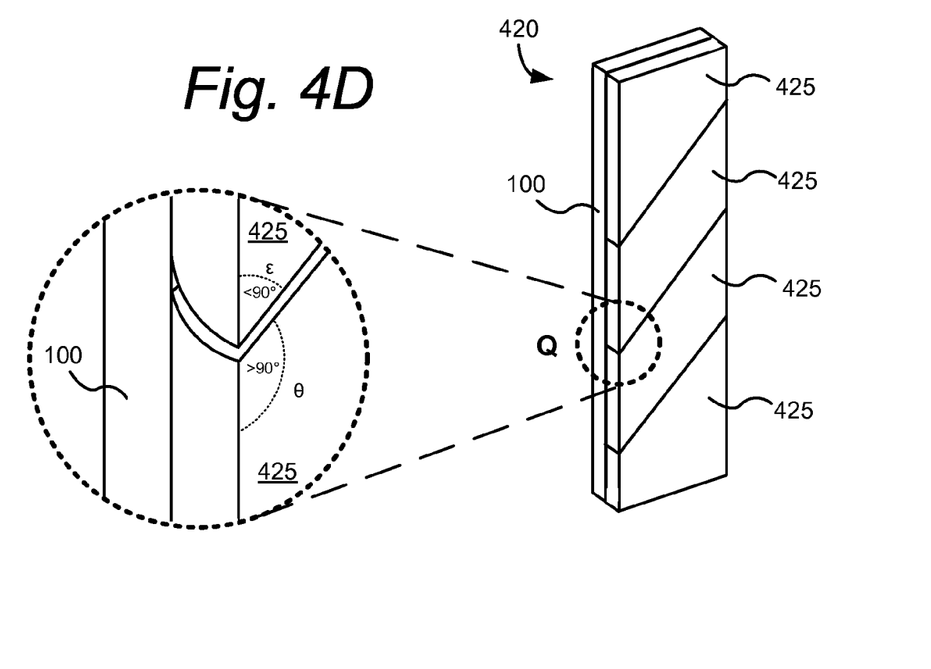
Figure 4E:
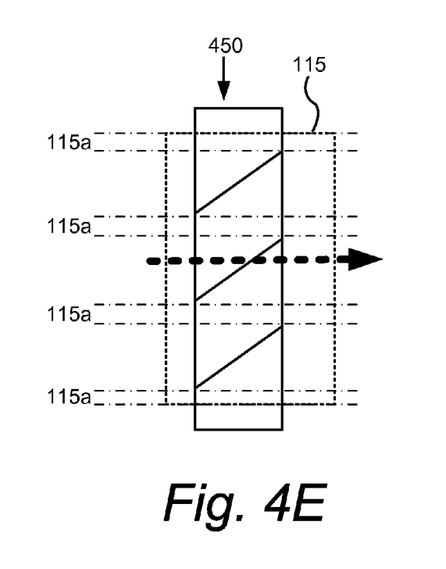
Figure 4F:
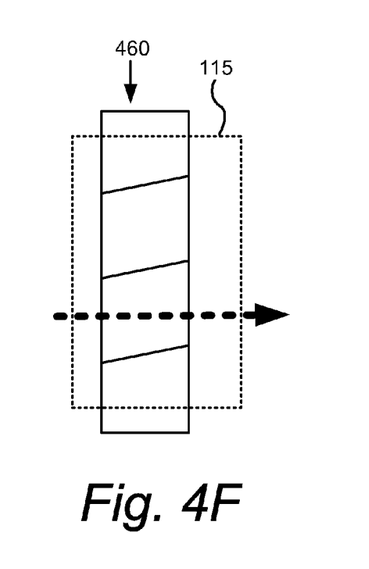
Figure 4G:
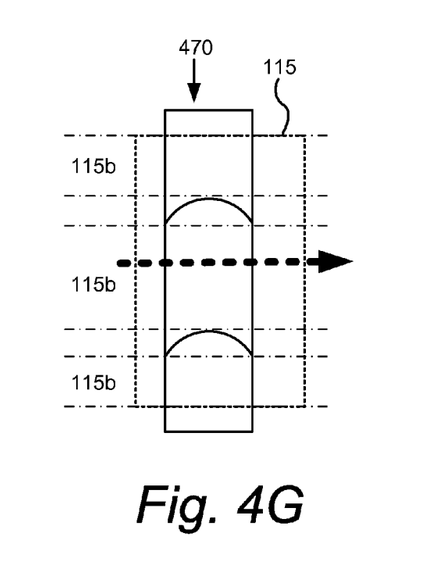
Figure 4H:
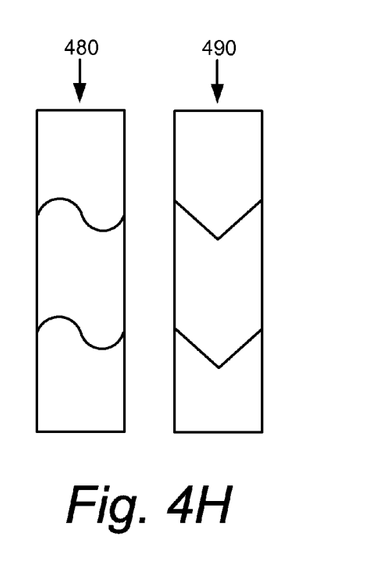

FIG. 4D depicts a similar sputter target assembly, 420, where sputter target sections 425 are assembled to create a target area having gaps between sections 425. In this example, the edges of the target sections are curved in a convex or concave manner (so their cross section when assembled looks much like the cross section of assembly 340 in FIG. 3A) in order to provide overlap when assembled. This is exemplified in expanded section Q. This is an example where there is no line of sight to the backing plate. One of ordinary skill in the art would appreciate that a target assembly such as described in relation to FIG. 4D could have, e.g., any of the cross-sections depicted in FIG. 3A. That is, there are any number of configurations of target edge overlapping regions that would obscure the backing support from a line of sight, that is, prevent a line of sight to the backing support through the seams between the sputter target sections (from the perspective of areas of a substrate that are exposed to sputter plasma during deposition).

As described in relation to FIG. 3B, sputter target assemblies can be cylindrical. In accord with methods described where sputter target sections are configured so that substantially all of the work surface of the substrate is exposed to the same ratio of sputter target surface area and any non-sputter target area and/or seams between the two or more sputter target sections during sputter deposition, cylindrical sputter target sections can be configured as described with respect to FIGS. 5A and 5B.

Figure 5A:
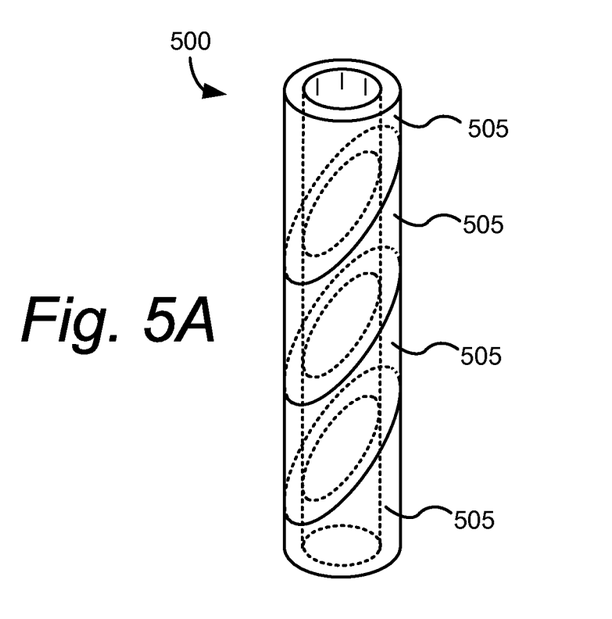
FIGS. 5A and 5B are perspectives of a cylindrical sputter target assembly.
Figure 5B:
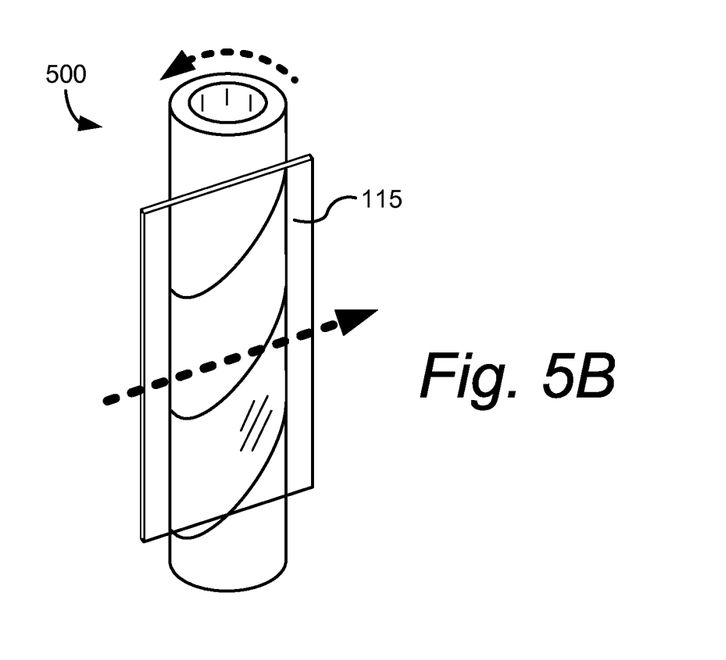

FIG. 5A depicts a sputter target assembly, 500, which includes sputter target sections, 505. In this example, sputter target assembly 500 is circular cylindrical (another example would be an ellipsoidal cylindrical sputter target assembly). Typically such a cylindrical sputter target assembly includes a backing support, such as a backing tube (not shown), upon which the sputter target sections 505 are assembled. In this example, sputter target sections 505 are cylindrical sleeve segments having either a cylindrical wedge shape or an oblique cylinder shape. As depicted in FIG. 5B, during sputter deposition, the sputter target assembly is rotated as substrate 115 is passed by the sputter target assembly. One of ordinary skill in the art would appreciate that, like the cylindrical target sections described in relation to FIG. 3B, the edges of sputter target sections 505 that are proximate each other (in this case having ellipsoid surfaces) can have overlapping portions (e.g., as described in relation to FIGS. 2A and 2B, and FIGS. 3A and 3B), so that there is no orthogonal, or any, line of sight to the backing support. Sections 505 may or may not touch each other when assembled.

One of ordinary skill in the art would appreciate that various combinations of the above embodiments are contemplated in this description. For example, a sputter target assembly may include sputter target sections that have overlapping edge regions as well as edge regions that do not overlap. For example, in the edge regions that do not overlap a portion of a backing plate may be exposed; the exposed portion may optionally be coated with a material that approximates the emissivity of the sputter target material.

Although the foregoing has been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. A method of using a sputter target assembly to sputter deposit material of a layer of an electrochromic device onto a work surface of a substrate, the sputter target assembly comprising two or more sputter target sections assembled on a backing support to form gaps between edges of adjacent target sections, the method comprising:
   (a) providing the substrate in a sputter chamber; and
   (b) passing the substrate past the sputter target assembly while sputtering the material of the layer of the electrochromic device onto the work surface of the substrate, the substrate passing in a direction that is not aligned with the gaps between adjacent sputter target sections;
   wherein passing the substrate past the sputter target assembly exposes the entire work surface of the substrate to the same ratio of sputter target surface area to area of the gaps between edges of adjacent sputter target sections.

2. The method of claim 1, wherein adjacent target sections are configured such that each of the gaps is at an angle with respect to the sputter target surface of the adjacent target sections, wherein while passing the substrate past the sputter target assembly so that there is no line of sight to between the work surface of the substrate and the backing support in a direction orthogonal to a surface of the backing support.

3. The method of claim 1, wherein the backing support is a backing plate, and wherein each of said two or more sputter target sections:
   i) is affixed to the backing plate; and
   ii) has a substantially planar sputter surface that is substantially co-planar with the other sputter surface or surfaces of said two or more sputter target sections.

4. The method of claim 1, wherein the backing support is a backing tube, and wherein the two or more sputter target sections are each cylindrical sleeve segments that, when assembled, form a cylindrical target assembly.

5. The method of claim 4, wherein the edges of the adjacent sputter target sections have overlapping regions that prevent said line of sight to the backing tube.

6. The method of claim 1, wherein (b) comprises a reciprocating translational motion of the substrate past the sputter target assembly.

7. The method of claim 1, wherein each of the one or more gaps is curved.

8. The method of claim 1, wherein the material being sputtered onto the work surface includes one of indium tin oxide, aluminum zinc oxide, indium zinc oxide, lithium, or a lithium compound.

9. The method of claim 1, where the material being sputtered onto the work surface includes an alloy, a compound, an oxide, or a nitride of a material including one of tungsten, molybdenum, vanadium, titanium, nickel, copper, aluminum, silicon, tantalum, and niobium.

* * * * *